US006642768B1

(12) United States Patent
Schell et al.

(10) Patent No.: US 6,642,768 B1
(45) Date of Patent: Nov. 4, 2003

(54) VOLTAGE-DEPENDENT IMPEDANCE SELECTOR FOR NON-LINEARITY COMPENSATION

(75) Inventors: John David Schell, Round Rock, TX (US); Adam Thomas Snider, Austin, TX (US); Edward C. Guerrero, Jr., Austin, TX (US); Christopher Eric Tressler, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 09/826,465

(22) Filed: Apr. 4, 2001

(51) Int. Cl.[7] .................................................. H03L 5/00

(52) U.S. Cl. ......................................... 327/308; 327/78

(58) Field of Search ................................ 327/306, 308, 327/540, 77, 78, 50; 333/81 R

(56) References Cited

U.S. PATENT DOCUMENTS

| | | | | | |
|---|---|---|---|---|---|
| 4,539,491 | A | * | 9/1985 | Nishioka et al. | 330/260 |
| 4,563,631 | A | * | 1/1986 | Mashino et al. | 322/33 |
| 4,985,808 | A | | 1/1991 | Zernov | 361/406 |
| 5,793,239 | A | * | 8/1998 | Kovacs et al. | 327/262 |
| 6,084,425 | A | | 7/2000 | Liaw et al. | 326/30 |
| 6,115,298 | A | | 9/2000 | Kwon et al. | 365/198 |
| 6,127,877 | A | | 10/2000 | Gabara | 327/362 |
| 6,316,991 | B1 | * | 11/2001 | Muyshondt et al. | 327/543 |

* cited by examiner

*Primary Examiner*—Dinh T. Le
(74) *Attorney, Agent, or Firm*—Robert C. Kowert; Meyertons, Hood, Kivlin, Kowert & Goetzel, P.C.

(57) ABSTRACT

A voltage-dependent impedance selector compensates for non-linearities that arise when the operating voltage of an electronic circuit changes. The voltage-dependent impedance selector includes a selection stage that selects a impedance based on the operating voltage of the electronic circuit. The selected impedance is connected to an output stage having a resistive value so that the selected impedance and the output stage form a voltage divider. The voltage-dependent impedance selector may, in some embodiments, be used in reference voltage generation or in impedance matching.

27 Claims, 5 Drawing Sheets

VOLTAGE-DEPENDENT IMPEDANCE SELECTOR FOR NON-LINEARITY COMPENSATION

BACKGROUND OF THE INVENTION

1. Field of the Invention

This invention relates to electronic circuits which may be used in computer systems and/or integrated circuits and, more particularly, to a voltage-dependent impedance selector for non-linearity compensation in a computer or other electronic system and/or an integrated circuit (IC).

2. Description of the Related Art

Voltage dividers are frequently used in electronic circuit design. Generally, a voltage divider outputs a voltage that is a fraction of an input voltage. FIG. 1 illustrates a simple voltage divider made from two resistors, R1 and R2, placed in series across an input voltage V. The output voltage is taken across R2 and equals V*R2/(R1+R2).

In electronic circuit design, it may be desirable to create a circuit that is capable of operating at several different operating voltages. For example, a circuit may be designed to operate with several different versions of a component. Each version of the component may operate at a different voltage, so the circuit may need to be able to operate at each of the possible operating voltages in order to be compatible with the different versions of the component. However, design of such a circuit may be frustrated if non-linearities arise when the circuit's operating voltage changes.

One possible non-linearity may arise when a circuit uses a reference voltage. A digital component may use a reference voltage to distinguish between logical states of a signal. For example, if a particular signal's magnitude is higher than the magnitude of the reference voltage, the signal may be interpreted to be high. This may correspond to a logical 1 for an active high signal or to a logical 0 for an active low signal. Conversely, if the signal's magnitude is lower than that of the reference voltage, the signal may be interpreted to be low. Often, a voltage divider across another voltage generates the reference voltage. As a result, the reference voltage equals a set percentage of that other voltage. In some circuits, however, certain components may not perform optimally at some or all of the possible operating voltages if the reference voltage is always set at the same percentage of another voltage. In these circuits, the optimal reference voltage percentage may vary according to which operating voltage is used. Thus, the optimal value of the reference voltage percentage may not vary linearly with the operating voltage of a circuit.

Another non-linearity may arise when designing an electronic circuit that includes impedance-matching circuitry. In circuits designed to be used in systems where signals are transmitted at very high speeds, impedance-matching circuitry may be used to reduce signal distortion caused by unmatched impedances along the transmission path of a signal. However, impedance-matching circuitry may be designed to operate at one operating voltage. As the operating voltage is changed, non-linearities may arise in the impedance-matching circuitry. These non-linearities may cause the impedance-matching circuitry to not perform optimally, creating a mismatch between impedances in the transmission path and resulting in unwanted signal reflections or other transmission problems.

SUMMARY

Various embodiments of a voltage-dependent impedance selector and methods of selecting an impedance based on an operating voltage are disclosed. In one embodiment, a voltage-dependent impedance selector may include a plurality of discrete impedances, a selection stage, and an output stage. The selection stage may be configured to dynamically select one of the discrete impedances depending on the operating voltage. When the operating voltage equals the first voltage, the selection stage may dynamically select the first impedance, and when the operating voltage equals the second voltage, the selection stage may dynamically select the second impedance. In one embodiment, the selection stage may include a comparator that compares the operating voltage to a voltage threshold. The selection stage may then indicate that the operating voltage equals a first voltage (or is within a first voltage range) if the operating voltage is greater than the voltage threshold and that the operating voltage equals a second voltage (or is within a second voltage range) if the operating voltage is less than the voltage threshold. The selection stage may couple an impedance to the output stage, which has its own impedance, to form a selected voltage divider. The impedance that is coupled to the output stage includes the impedance of the selected impedance and, in some embodiments, may also include the impedance of the selection stage. The selected voltage divider may divide an input voltage to generate an output voltage. The input voltage may be the operating voltage in one embodiment.

In some embodiments, the selected voltage divider may provide the output voltage as a reference voltage to another component so that the component may use the reference voltage to distinguish between logical states of a signal. The selected voltage divider may be configured to generate a reference voltage equal to a first percentage of the input voltage when the first impedance is selected and to generate a reference voltage equal to a second percentage of the input voltage when the second impedance is selected.

In other embodiments, the output stage may include an impedance matching compensation circuit, and the selected impedance may be a reference resistor. The impedance matching compensation circuit may match the impedance of an output driver to the impedance of the selected impedance.

In one embodiment of the voltage-dependent impedance selector, the selection stage may also include two transistors. One transistor may be coupled between the first impedance and the output stage and configured to turn on when the operating voltage is greater than the voltage threshold. The second transistor may be coupled between the second impedance and the output stage and configured to turn on when the operating voltage is less than the voltage threshold.

One embodiment may include a method for selecting an impedance. The method may include receiving an input voltage, determining the magnitude of an operating voltage, selecting a impedance from a plurality of discrete impedances based on the magnitude of the operating voltage, and dividing the input voltage across the selected impedance and an output stage to generate an output voltage. A first impedance may be selected if the operating voltage equals a first voltage (or exceeds a threshold) and a second impedance may be selected if the operating voltage equals a second voltage (or is less than the threshold).

In one embodiment, the method may also include comparing the output voltage to a signal (or otherwise using the output voltage) to determine the logical stage of the signal. In another embodiment, the method may include matching an output impedance of an output driver to the selected impedance.

Figure 1:
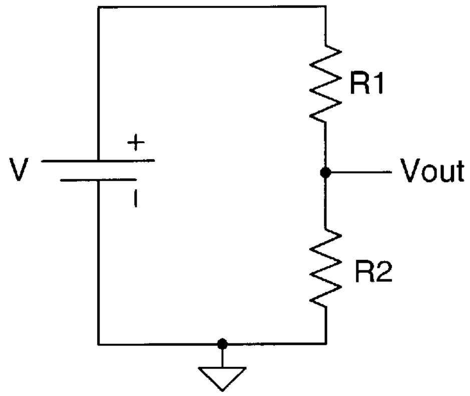
FIG. 1 shows a simple voltage divider.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 2:
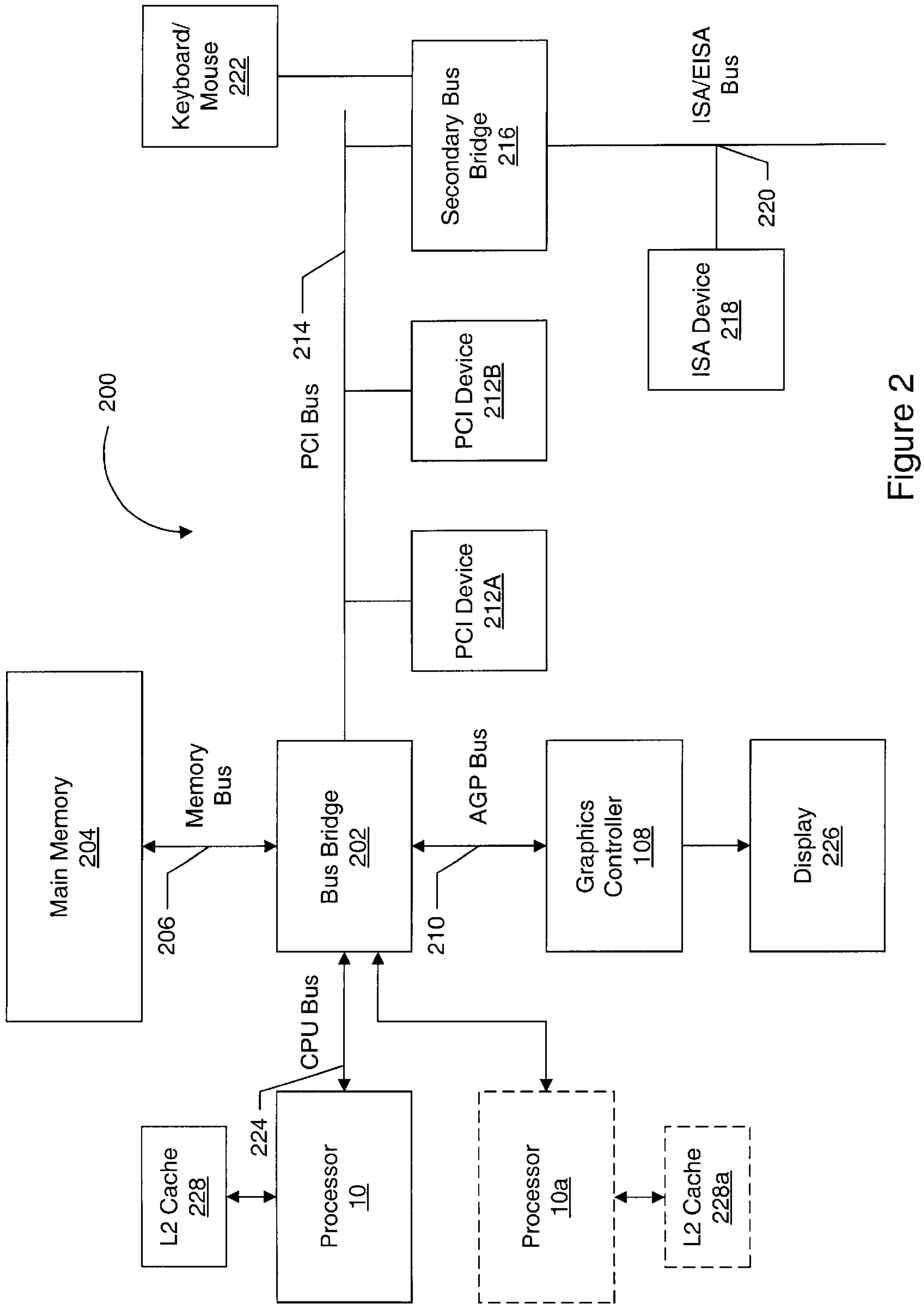
FIG. 2 shows a block diagram of a computer system.

FIG. 2 shows a block diagram of one embodiment of a computer system 200 that includes processor 10 coupled to a variety of system components through a bus bridge 202. Other embodiments are possible and contemplated. In the depicted system, a main memory 204 is coupled to bus bridge 202 through a memory bus 206, and a graphics controller 208 is coupled to bus bridge 202 through an AGP bus 210. Several PCI devices 212A–212B are coupled to bus bridge 202 through a PCI bus 214. A secondary bus bridge 216 may also be provided to accommodate an electrical interface to one or more EISA or ISA devices 218 through an EISA/ISA bus 220. Processor 10 is coupled to bus bridge 202 through a CPU bus 224 and to an optional L2 cache 228.

Bus bridge 202 provides an interface between processor 10, main memory 204, graphics controller 208, and devices attached to PCI bus 214. When an operation is received from one of the devices connected to bus bridge 202, bus bridge 202 identifies the target of the operation (e.g. a particular device or, in the case of PCI bus 214, that the target is on PCI bus 214). Bus bridge 202 routes the operation to the targeted device. Bus bridge 202 generally translates an operation from the protocol used by the source device or bus to the protocol used by the target device or bus.

In addition to providing an interface to an ISA/EISA bus for PCI bus 214, secondary bus bridge 216 may incorporate additional functionality as desired. An input/output controller (not shown), either external from or integrated with secondary bus bridge 216, may also be included within computer system 200 to provide operational support for a keyboard and mouse 222 and for various serial and parallel ports. An external cache unit (not shown) may further be coupled to CPU bus 224 between processor 10 and bus bridge 202 in other embodiments. Alternatively, the external cache may be coupled to bus bridge 202 and cache control logic for the external cache may be integrated into bus bridge 202. L2 cache 228 is further shown in a backside configuration to processor 10. It is noted that L2 cache 228 may be separate from processor 10, integrated into a cartridge (e.g. slot 1 or slot A) with processor 10, or even integrated onto a semiconductor substrate with processor 10.

Main memory 204 is a memory in which application programs are stored and from which processor 10 primarily executes. A suitable main memory 204 comprises DRAM (Dynamic Random Access Mermory). For example, a plurality of banks of SDRAM (Synchronous DRAM) or Rambus DRAM (RDRAM) may be suitable.

PCI devices 212A–212B are illustrative of a variety of peripheral devices that may be included in computer system 200, such as network interface cards, video accelerators, audio cards, hard or floppy disk drives or drive controllers, SCSI (Small Computer Systems Interface) adapters, and telephony cards. Similarly, ISA device 218 is illustrative of various types of peripheral, devices, such as a modem, a sound card, and a variety of data acquisition cards such as GPIB or field bus interface cards.

Graphics controller 208 is provided to control the rendering of text and images on a display 226. Graphics controller 208 may embody a typical graphics accelerator generally known in the art to render three-dimensional data structures which can be effectively shifted into and from main memory 204. Graphics controller 208 may therefore be a master of AGP bus 210 in that it can request and receive access to a target interface within bus bridge 202 to thereby obtain access to main memory 204. A dedicated graphics bus accommodates rapid retrieval of data from main memory 204. For certain operations, graphics controller 208 may be further configured to generate PCI protocol transactions on AGP bus 210. The AGP interface of bus bridge 202 may thus include functionality to support both AGP protocol transactions as well as PCI protocol target and initiator transactions. Display 226 is any electronic display upon which an image or text can be presented. A suitable display 226 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 200 may be a multiprocessing computer system including additional processors (e.g. processor 10*a* shown as an optional component of computer system 200). Processor 10*a* may be similar to processor 10. More particularly, processor 10*a* may be an identical copy of processor 10. Processor 10*a* may be connected to bus bridge 202 via an independent bus (as shown in FIG. 2) or may share CPU bus 224 with processor 10. Furthermore, processor 10*a* may be coupled to an optional L2 cache 228*a* similar to L2 cache 228.

Integrated circuits and/or electronic circuits which may be used in computer systems may be designed to be operable at several different operating voltages. Some of these circuits may have been designed that way to accommodate various versions of one or more components. For example, most processors, such as processor 10 in FIG. 2, historically operated at the same core voltage, which was typically 5 volts. Now, as processors are being designed to have ever-decreasing power consumption, new processors may require different voltages than their predecessors and competitors. Also, a manufacturer may offer different versions of a processor that operate at different core voltages. For example, Advanced Micro Devices, Inc. manufactures many different computer components, including the Duron™ and Athlon™ processors. The Athlon and Duron may operate at different core voltages. Because these processors may have different operating voltages, circuits designed to be compatible with both versions of AMD's processors may need to be operable at each of the possible core voltages. However, when circuits are designed to be operable at several different operating voltages, certain non-linearities may arise when the operating voltage is changed.

Figure 3:
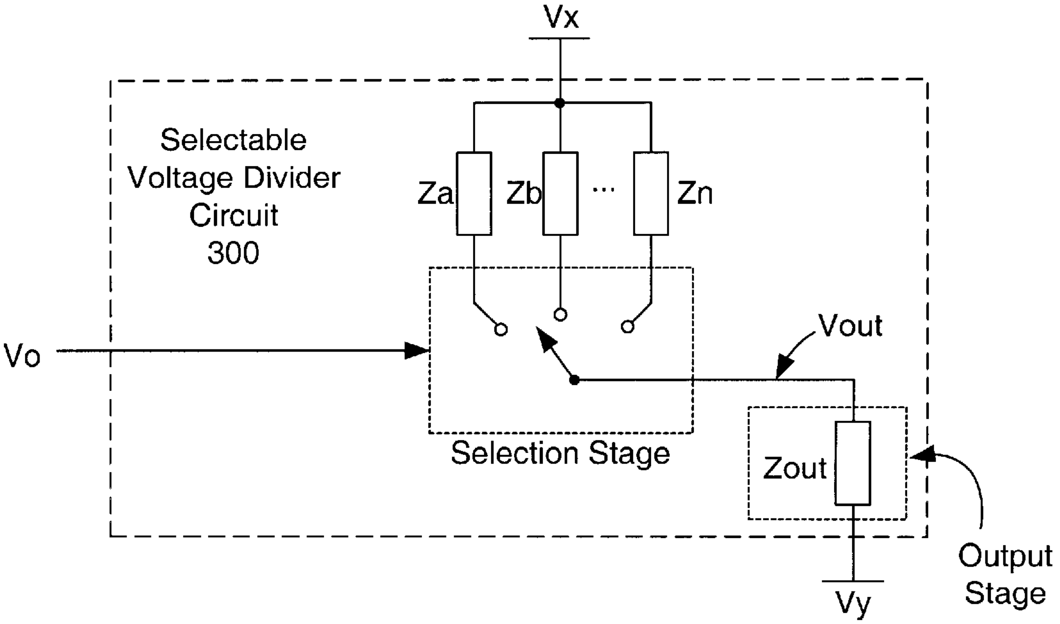
FIG. 3 shows a block diagram of a voltage-dependent impedance selector.

FIG. 3 shows a block diagram of one embodiment of a voltage-dependent impedance selector 300 that selects one of a plurality of impedances according to the value of an input voltage, labeled Vo. The voltage-dependent impedance selector may be used in any number of applications but is illustrated in FIG. 3 as part of a voltage-divider so that a voltage-dependent impedance selector may be provided. This voltage-dependent impedance selector may be used to compensate for non-linearities that arise when the operating voltage of an integrated circuit and/or computer system is changed. A selection stage may select between several impedances, Za–Zn, and couple the selected impedance, Zselected, to an output stage. The input voltage, Vo, controls the selection stage. The value of Vo determines which impedance is selected by the selection stage. Whenever an impedance is selected, it is connected to the output stage, which has an impedance Zout, to form a voltage divider across Vx or Vy. In some embodiments, Vx may be a positive voltage and Vy may be grounded or vice versa. In other embodiments, Vy may be a negative voltage and Vx may be grounded or vice versa. In some embodiments, Vx or Vy may equal Vo. An output voltage is produced at the point where the selected impedance is coupled to the output stage. The output voltage will equal (Vx−Vy)*Zout/(Zselected+Zout), and thus the output voltage varies according to the value of the selected impedance.

In one embodiment, the impedance of the selection stage may be negligible. However, the selection stage of the voltage-dependent impedance selector 300 may, in some embodiments, have an impedance that is non-negligible and thus affects the impedance of either the selected impedance or the output stage, or both. For example, in an embodiment such as that illustrated in FIG. 3, the impedance of the selection stage may be added to that of the selected impedance when the selected impedance is connected to the output stage. Thus, the impedance that is connected to the output stage may effectively include the selected impedance and the impedance of the selection stage. In other embodiments, the impedance of the selection stage may be added to that of the output stage when the selected impedance is connected to the output stage. Values of Za–Zn may be chosen to account for the impedance of the selection stage.

The following figures and discussion provide specific examples of non-linearities that may arise in electronic circuits when the operating voltage of those circuits is changed and of voltage-dependent impedance selectors or voltage dividers configured to compensate for those non-linearities.

One situation where non-linearities may arise is reference voltage generation. Various components in integrated circuits and/or in computer systems may require a reference voltage. A digital component may use a reference voltage to distinguish between high and low states of a signal. For example, an IC such as the processor 10 or the bus bridge 202 may use differential receivers. Differential receivers at the signal inputs of an IC may use a reference voltage to interpret the logical state of a received signal. For example, if a particular signal's magnitude is higher than the magnitude of the reference voltage, the signal may be interpreted to be high, while if the signal's magnitude is lower than that of the reference voltage, the signal may be interpreted as low. Similarly, a component in an integrated circuit and/or a computer system may use a reference voltage to clock in data by having a differential amplifier compare the reference voltage level to the voltage level of an external clock signal. For example, if the component clocks in data on the rising edge, the differential amplifier may signal the component to latch in data every time the external clock signal transitions above the reference voltage.

A reference voltage may be generated from another voltage using a voltage divider. For example, in a computer system, a reference voltage may be generated by a voltage divider across the core voltage. In platforms using an Athlon processor, for example, the reference voltage may be set by a precision (e.g. 1%) resistor voltage divider across the core voltage. The divider resistor values may be approximately equal, and thus the voltage divider may divide the core voltage approximately in half. For example, if the core voltage equals 1.75V, the voltage divider may set the reference voltage to 850 mV.

It may be desirable to have a motherboard that could operate with either Athlon or Duron processors. This may require that the motherboard be capable of operating at both the Athlon's and the Duron's associated core voltage. However, when the core voltage is changed, various components may respond in undesirable ways. For example, in systems where a voltage divider across the core voltage is used the set the reference voltage, the value of the reference voltage will scale linearly with the value of the core voltage. Thus, the reference voltage will equal the same percentage of the core voltage for each value of the core voltage. However, some ICs, such as a processor or a bus bridge, may not perform optimally when the reference voltage equals the same percentage of the core voltage for all values of the core voltage. For example, in some systems, setting the reference voltage to equal a different percentage of the core voltage for different values of the core voltage-may result in better stability for certain devices due to characteristics of those devices. Thus, in a system expected to work with many different processors, a single voltage divider may not provide the best reference voltage for all possible values of the core voltage. Similarly, in any integrated circuit that is intended to operate at several different voltages, a single voltage divider or other type of impedance selection circuit may not optimally provide a needed voltage at all of the possible operating voltages.

Figure 4:
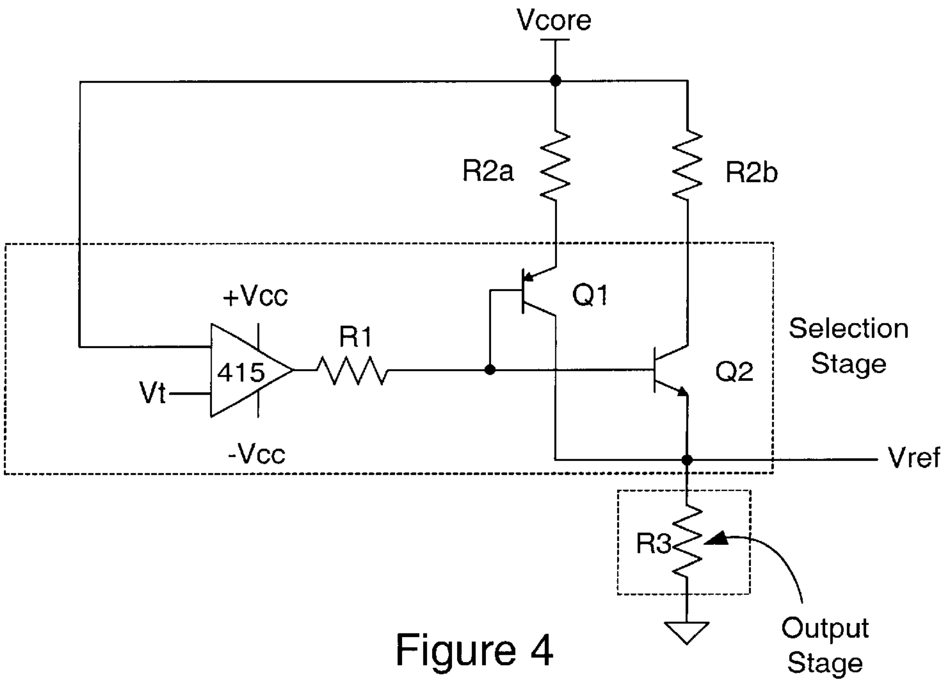
FIG. 4 shows one embodiment of a voltage-dependent impedance selector configured to generate different reference voltages depending on the value of the core voltage.

FIG. 4 shows one embodiment of a voltage-dependent impedance selector configured to generate a reference voltage as a percentage of the operating voltage, where the percentage depends on the magnitude of the operating voltage. In this embodiment, the voltage-dependent impedance selector is configured for use in a computer system designed to operate at either of two possible operating voltages. It is noted that other embodiments may be configured to for use with more than two possible operating voltages. The desired values of the reference voltage may not scale linearly with the values of the operating voltage. Thus, for each operating voltage, the appropriate corresponding reference voltage may be generated by the voltage-dependent impedance selector. In this embodiment of the voltage-dependent impedance selector, the selection stage may include a comparator 415, two transistors Q1 and Q2, and a resistor R1. In this embodiment, the selection stage may select one of two resistors, R2*a* and R2*b*, and connect the selected resistor to the output stage, which includes R3. The operating voltage magnitude may be determined by comparison to a voltage threshold, Vt, using comparator 415. The comparator may output +Vcc if the operating voltage is higher than Vt and −Vcc if the operating voltage is lower than Vt. Thus, if Vt is chosen to be between the two operating voltages at which the system is designed to operate, the comparator can identify which core voltage the system is currently using. Vt may be generated by a voltage divider, zener diode, linear regulator, or any other means of generating a DC level voltage.

The voltage-dependent impedance selector shown in FIG. 4 may be integrated with another component in some embodiments (e.g. part of an integrated circuit). In other embodiments, the voltage-dependent impedance selector may instead be implemented as a separate IC or as a set of discrete components on a circuit board.

The transistors Q1 and Q2 may be configured so that Q1 turns on and Q2 turns off if the comparator outputs +Vcc and Q2 turns on and Q1 turns off if the comparator outputs −Vcc. When Q1 turns on, R2*a* is connected to the output stage, and when Q2 turns on, R2*b* is connected to the output stage. Thus, in this embodiment, the voltage-dependent impedance selector can dynamically switch between voltage dividers depending on the value of the core voltage.

For example, one processor that may be used in the system may have a core voltage of 1.7 V and optimally require a reference voltage equal to 40% of Vcore. Another processor may have a core voltage of 1.5 V and an optimal reference voltage equal to 50% of the core voltage. In one embodiment, the output stage of the voltage-dependent impedance selector shown in FIG. 4 may be a 200-ohm resistor. R2*a* may be a 200-ohm resistor and R2*b* may be a 300-ohm resistor. If R2*a* is connected to the output stage, the resulting voltage divider produces an output voltage that is approximately 50% of the input voltage (assuming a negligible voltage drop across Q1). If R2*b* is connected to the output stage, the resulting voltage divider produces an output voltage that is approximately 40% of the input voltage (again assuming a negligible voltage drop across Q2). In some embodiments, the voltage drop across Q1 or Q2 may not be negligible, and the values of the resistors R2*a*, R2*b* and/or R3 may be adjusted to compensate for the transistor voltage drop. For example, the value of R2*a* may be changed to 175 ohms, and the value of R2*b* may be changed to 270 ohms.

Another situation where non-linearities may arise is impedance matching. In systems where signals are transmitted at very high speeds, impedance matching may be a concern. For example, in a computer system, signals may be transmitted from one integrated circuit (IC) to the motherboard and then from the motherboard to another integrated circuit. If the impedance of either the sending or receiving IC does not match the characteristic impedance of the motherboard, the signal may be reflected. This signal reflection may cause distortion in the transmitted signal, leading to problems such as reduced noise immunity. Matching the output impedance of the sending IC and the input impedance of the receiving IC to the characteristic impedance of the motherboard may prevent signal reflection and minimize signal distortion.

In one embodiment, matching the output impedance of an IC to the characteristic impedance of a motherboard involves matching the impedance of the IC's output driver (s) to that of a reference resistor placed on the motherboard. The reference resistor is chosen to enable impedance-matching circuitry to match the impedance of the IC to the characteristic impedance of the motherboard. In some embodiments, the reference resistor may be chosen to approximate the characteristic impedance of the motherboard. The impedance of the reference resistor and of the IC's output driver(s) may be matched by using the reference resistor as part of a voltage divider. For example, looking back at FIG. 1, R1 may represent the reference resistor. R2 may represent the impedance of a compensation circuit that dynamically matches the output impedance of the IC to the reference resistor. When the impedances are matched, the output voltage equals one-half of the input voltage because when R1=R2, Vout=V*R1/(2*R1)=V*½.

In one embodiment, the output driver being compensated may include a number of transistors arranged in parallel. Turning on more transistors may decrease the output impedance. Compensation circuits may match impedances by changing the current across R2 in steps until the output voltage from the voltage divider equals half of the input voltage in some embodiments. The number of current steps may correlate to how many of the output driver transistors should be turned on or off in order to match the impedances. Thus, a compensation circuit may match the output impedance of an IC to that of a reference resistor using a voltage divider. As the core voltage is changed, however, non-linearities may arise in either the compensation circuit or in the drive strength of the output driver(s) being compensated. These non-linearities may cause the compensation circuit to incorrectly set the output impedance, creating a mismatch between the output driver impedance and the motherboard impedance and resulting in unwanted signal reflections or other transmission problems.

Figure 5:
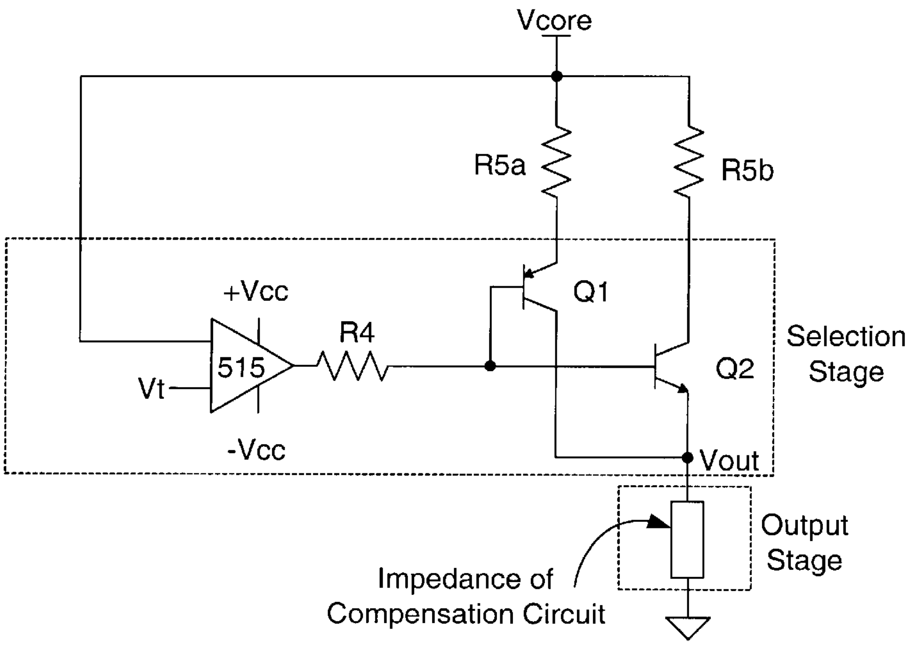
FIG. 5 shows one embodiment of a voltage-dependent impedance selector configured to select different reference resistors to be used by an impedance matching compensation circuit depending on the value of the core voltage.

FIG. 5 shows another embodiment of a voltage-dependent impedance selector configured to select a different reference impedance depending on a value of the core voltage in a system designed to operate at either of two possible core voltage values. The voltage-dependent impedance selector may be configured to provide a reference impedance to a compensation circuit to enable the compensation circuit to match an output impedance to the impedance of the reference impedance. The selectable impedances may each have a impedance appropriate for use in matching the characteristic impedance of the motherboard at a corresponding core voltage. The selectable impedances may be tied to the core voltage (e.g. when the output being compensated has a PMOS driver) or to ground (e.g. when the output has an NMOS driver). This voltage-dependent impedance selector may be integrated with another component in some embodiments. In other embodiments, the voltage-dependent impedance selector may instead be implemented as a separate IC or as a set of discrete components on a circuit board.

In one embodiment of the voltage-dependent impedance selector, the selection stage may include a comparator 515, two transistors Q3 and Q4, and a resistor R4. In this embodiment, the selection stage may select one of two impedances, R5*a* and R5*b*, and connect the selected impedance to the output stage. The core voltage level may be determined by comparison to a voltage threshold, Vt, using comparator 515. The comparator outputs +Vcc if the core voltage is higher than Vt and outputs −Vcc if the core voltage is lower than Vt. Thus, if Vt is chosen to lie between the two core voltages at which the system is designed to operate, the comparator can identify which core voltage the system is currently using. Vt may be generated by a voltage divider, zener diode, linear regulator, or any other means of generating a DC level voltage.

The transistors Q3 and Q4 may be configured so that Q3 turns on and Q4 turns off when the comparator outputs +Vcc and Q4 turns on and Q3 turns off when the comparator outputs −Vcc. When Q3 turns on, R5*a* is connected to the output stage, and when Q4 turns on, R5*b* is connected to the output stage. Connecting either R5*a* or R5*b* to the output stage forms a voltage divider. Thus, the voltage-dependent impedance selector can dynamically switch between voltage dividers depending on the value of the core voltage.

In this embodiment, the output stage is a compensation circuit configured to match an output driver's impedance to the selected reference impedance. In some embodiments, the compensation circuit may have matched the impedance of the output driver to that of the motherboard when the output voltage from the selected voltage divider equals half of the input voltage. In some embodiments, the voltage drop across the transistors Q3 and Q4 may not be negligible. Thus, some embodiments may adjust the values of the impedances to compensate for the transistor voltage drops. Alternately, some embodiments may modify the compensation circuit to compensate for the transistor voltage drops.

Figure 6A:
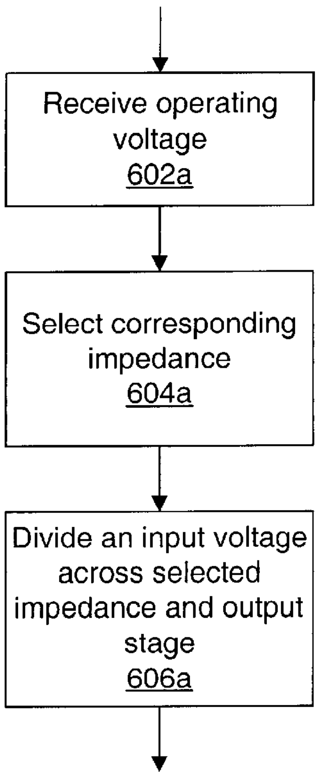
FIG. 6*a* is a flowchart illustrating one method of dynamically selecting an impedance based on an operating voltage.
Figure 7:
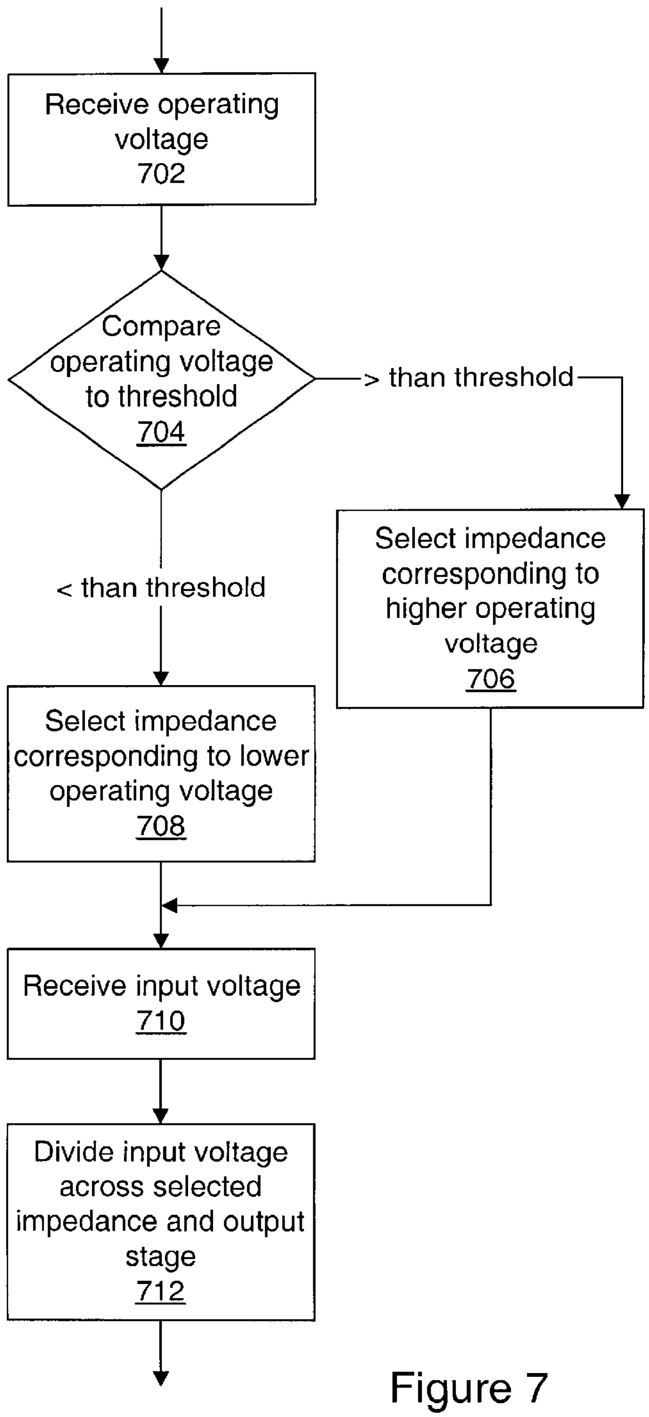
FIG. 7 illustrates another method of dynamically selecting an impedance based on an operating voltage.

There are many situations where non-linearities may arise when the operating voltage is changed. FIG. 6*a* illustrates one embodiment of a method of selecting an impedance according to an operating voltage. An operating voltage is received, as indicated at 602*a*. An impedance corresponding to the operating voltage is selected, as indicated at 604*a*. In some embodiments, determining which impedance corresponds to the operating voltage may involve comparing the operating voltage to a threshold voltage, as shown in FIG. 7. In some embodiments, an impedance may be selected by turning on a transistor connected in series to the corresponding impedance. In one embodiment, the selected impedance may be coupled to an output stage so that the selected impedance and the output stage form a voltage divider across an input voltage, as indicated at 606*a*. In some embodiments, the input voltage may be the operating voltage for a circuit or system.

Figure 6B:
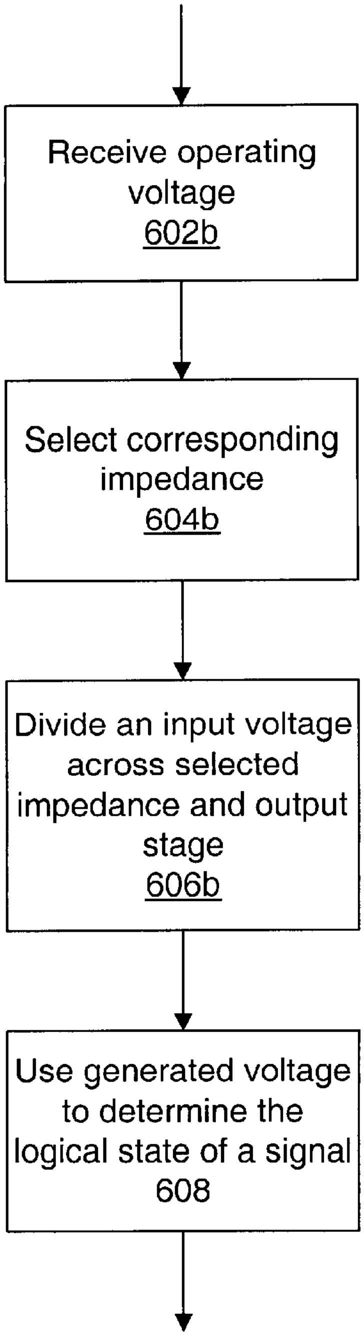
FIG. 6*b* is a flowchart illustrating one method of dynamically selecting an impedance based on an operating voltage in order to compensate for non-linearities that arise in reference voltage generation.

FIG. 6*b* shows the method of FIG. 6*a* adapted for use when non-linearities arise during reference voltage generation at different operating voltages. An operating voltage is received, as indicated at 602*b*. An impedance corresponding to the operating voltage is selected, as indicated at 604*b*. In some embodiments, determining which impedance corresponds to the operating voltage may involve comparing the operating voltage to a threshold voltage, as shown in FIG. 7. In some embodiments, an impedance may be selected by turning on a transistor connected in series to the corresponding impedance. In one embodiment, the selected impedance may be coupled to an output stage so that the selected impedance and the output stage form a voltage divider across an input voltage, as indicated at 606*b*. Thus, the voltage divider may divide the input voltage differently depending on which impedance is selected. The voltage generated by the voltage divider may then be used as a reference voltage to determine the logical state of a signal, as indicated at 608. In some embodiments, the input voltage may be the operating voltage for a circuit or system.

Figure 6C:
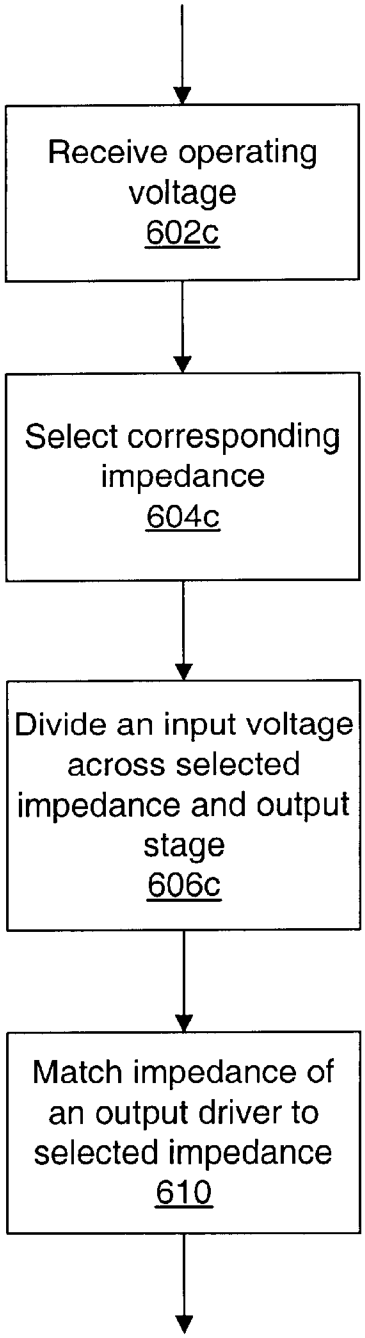
FIG. 6*c* is a flowchart illustrating one method of dynamically selecting an impedance based on an operating voltage in order to compensate for non-linearities that arise in impedance matching.

FIG. 6*c* shows the method of FIG. 6*a* adapted for use when non-linearities arise during impedance matching at different operating voltages. This embodiment selects an impedance depending on the operating voltage. The selected impedance is connected to an output stage to form a voltage divider across an input voltage. The operating voltage is received, as indicated at 602*c*. The impedance corresponding to the operating voltage is selected, as indicated at 604*c*. In some embodiments, determining which impedance corresponds to the operating voltage may involve comparing the operating voltage to a threshold voltage, as shown in FIG. 7. In some embodiments, an impedance may be selected by turning on a transistor connected in series to the corresponding impedance. The selected impedance may be coupled to an output stage so that in one embodiment the selected impedance and the output stage form a voltage divider across an input voltage, as indicated at 606*c*. Then, an output driver's impedance is matched to the selected impedance, as indicated at 610. In some embodiments, the output stage may include impedance-matching circuitry configured to match the impedance of an output driver to the selected impedance by observing the voltage generated by the voltage divider formed from the selected impedance and the output stage. In these embodiments, the impedance-matching circuitry may have matched impedances when the voltage divider outputs a voltage equal to half the input voltage. Other embodiments may use different methods of impedance matching.

FIG. 7 illustrates another embodiment of a method of selecting an impedance to include in a voltage divider by comparing the operating voltage to a threshold voltage. This embodiment divides an input voltage (received as indicated at 710) differently depending on the magnitude of an operating voltage (received as indicated at 702). In some embodiments, the input voltage and the operating voltage may be the same. Depending on the magnitude of the operating voltage, different impedances may be selected. The operating voltage may be compared to a threshold voltage, as indicated at 704. As shown at 706, if the operating voltage is greater than the threshold, the impedance corresponding to a higher operating voltage is selected. If the operating voltage is less than the threshold, as shown at 708, the impedance corresponding to a lower operating voltage is selected. Once an impedance is selected, the selected impedance may be coupled to an output stage to form a voltage divider across an input voltage, as indicated at 712.

Numerous variations and modifications will become apparent to those skilled in the art once the above disclosure is fully appreciated. It is intended that the following claims be interpreted to embrace all such variations and modifications.

What is claimed is:

1. A system comprising:

a plurality of discrete impedances;

a selection stage configured to dynamically select a first impedance from the plurality of discrete impedances when an input voltage is equal to a first voltage and to dynamically select a second impedance from the plurality of discrete impedances when the input voltage is equal to a second voltage; and an output stage having an output stage impedance;

wherein the selection stage is configured to couple an impedance to the output stage to form a selected voltage divider, wherein the coupled impedance comprises a selected one of the plurality of discrete impedances; and wherein the selected voltage divider is configured to divide the input voltage across the coupled impedance and the output stage to generate an output voltage.

2. The system of claim 1, wherein the selection stage comprises at least one comparator configured to compare the input voltage to a voltage threshold, and wherein the selection stage is configured to dynamically select the first impedance from the plurality of discrete impedances if the input voltage is greater than the first voltage, wherein the first voltage is greater than the voltage threshold.

3. The system of claim 2, wherein the second voltage is less than the voltage threshold.

4. The system of claim 2, wherein the selection stage further comprises at least two transistors, wherein a first transistor is coupled between the first impedance and the output stage, wherein a second transistor is coupled between the second impedance and the output stage, and wherein the selection stage is further configured to turn on the first transistor when the input voltage is greater than the voltage threshold and to turn on the second transistor when the input voltage is less than the voltage threshold.

5. The system of claim 1, wherein the selection stage is further configured to select a third impedance from the plurality of discrete impedances if the input voltage equals a third voltage.

6. A system comprising:

a component;

a plurality of discrete impedances;

a selection stage configured to dynamically select a first impedance from the plurality of discrete impedances when a first voltage is equal to a second voltage and to dynamically select a second impedance from the plurality of discrete impedances when the first voltage is equal to a third voltage; and an output stage, wherein the output stage has an output stage impedance;

wherein the selection stage is configured to couple an impedance to the output stage to form a selected voltage divider, wherein the coupled impedance comprises a selected one of the plurality of discrete impedances;

wherein the selected voltage divider is configured to receive an input voltage and to divide an input voltage across the coupled impedance and the output stage to generate an output voltage, and wherein the component is coupled to receive the output voltage from the output stage and configured to determine a logical state of a signal by comparing a voltage level of a signal to a voltage level of the output voltage.

7. The system of claim 6, wherein the selected voltage divider is configured to generate the output voltage equal to a first percentage of the input voltage when the first impedance is selected and to generate the output voltage equal to a second percentage of the input voltage when the second impedance is selected.

8. A system comprising:

a plurality of discrete impedances;

a selection stage configured to dynamically select a first impedance from the plurality of discrete impedances when a first voltage is equal to a second voltage and to dynamically select a second impedance from the plurality of discrete impedances when the first voltage is equal to a third voltage; and an output stage having an output stage impedance, wherein the output stage comprises an impedance matching compensation circuit;

wherein the selection stage is configured to couple an impedance to the output stage to form a selected voltage divider, wherein the coupled impedance comprises a selected one of the plurality of discrete impedances; and wherein the selected voltage divider is configured to receive an input voltage and to divide the input voltage across the coupled impedance and the output stage to generate an output voltage.

9. The system of claim 8, further comprising an output driver, wherein the impedance matching compensation circuit is configured to match an impedance of the output driver to the coupled impedance.

10. The system of claim 8, wherein the plurality of discrete impedances comprise a plurality of discrete reference resistors, and wherein the first impedance comprises a first reference resistor and the second impedance comprises a second reference resistor.

11. A system comprising:

an integrated circuit comprising a core supplied by an operating voltage;

a plurality of discrete impedances;

a selection stage coupled to the core and configured to dynamically select a first impedance from the plurality of discrete impedances when the operating voltage is equal to a first voltage and to dynamically select a second impedance from the plurality of discrete impedances when the operating voltage is equal to a second voltage; and an output stage having an output stage impedance; wherein the selection stage is configured to couple an impedance to the output stage to form a selected voltage divider, wherein the coupled impedance comprises a selected one of the plurality of discrete impedances; and wherein the selected voltage divider is configured to receive an input voltage and to divide the input voltage across the coupled impedance and the output stage to generate an output voltage.

12. The system of claim 11, wherein the coupled impedance further comprises an impedance of the selection stage.

13. The system of claim 11, wherein the output stage impedance comprises an impedance of the selection stage.

14. The system of claim 11, wherein the input voltage is the operating voltage.

15. A method comprising:

supplying an operating voltage to a core of an integrated circuit;

receiving an input voltage;

selecting a selected impedance from a plurality of discrete impedances, wherein the selected impedance equals a first impedance if the operating voltage equals a first voltage and wherein the selected impedance equals a second impedance if the operating voltage equals a second voltage;

coupling an impedance to an output stage, wherein the coupled impedance comprises the selected impedance; and dividing an input voltage across the selected impedance and the output stage to generate an output voltage.

16. The method as recited in claim 15, further comprising comparing the operating voltage to a voltage threshold, wherein the first voltage is greater than the voltage threshold.

17. The method as recited in claim 16, wherein the second voltage is less than the voltage threshold.

18. The method as recited in claim 15, further comprising comparing the output voltage to a signal in order to determine a logical stage of the signal.

19. The method as recited in claim 15, wherein the input voltage equals the operating voltage.

20. The method as recited in claim 15, further comprising matching an output impedance of an output driver to the selected impedance.

21. The method as recited in claim 15, wherein the selected impedance equals a third impedance if the operating voltage equals a third voltage.

22. A method comprising:

receiving an input voltage;

selecting a selected impedance from a plurality of discrete impedances, wherein the selected impedance equals a first impedance if the input voltage equals a first voltage and wherein the selected impedance equals a second impedance if the input voltage equals a second voltage;

coupling an impedance to an output stage, wherein the coupled impedance comprises the selected impedance; and dividing the input voltage across the selected impedance and the output stage to generate an output voltage.

23. The method as recited in claim 22, further comprising comparing the output voltage to a signal in order to determine a logical stage of the signal.

24. The method as recited in claim 22, further comprising matching an output impedance of an output driver to the selected impedance.

25. The method as recited in claim 22, wherein the selected impedance equals a third impedance if the input voltage equals a third voltage.

26. A method comprising:

receiving a first voltage;

selecting a selected impedance from a plurality of discrete impedances, wherein the selected impedance equals a first impedance if a first voltage equals a second voltage and wherein the selected impedance equals a second impedance if the first voltage equals a third voltage;

coupling an impedance to an output stage, wherein the coupled impedance comprises the selected impedance;

dividing an input voltage across the selected impedance and the output stage to generate an output voltage; and determining a logical state of a signal by comparing a voltage level of the signal to a voltage level of the output voltage.

27. A method comprising:

receiving a first voltage;

selecting a selected impedance from a plurality of discrete impedances, wherein the selected impedance equals a first impedance if a first voltage equals a second voltage and wherein the selected impedance equals a second impedance if the first voltage equals a third voltage;

coupling an impedance to an output stage, wherein the coupled impedance comprises the selected impedance;

dividing an input voltage across the selected impedance and the output stage to generate an output voltage; and matching an output impedance of an output driver to the selected impedance.

* * * * *